US009331605B2

(12) United States Patent
Shibuya

(10) Patent No.: US 9,331,605 B2
(45) Date of Patent: May 3, 2016

(54) LOWER ELECTRODE FOR PIEZOELECTRIC ELEMENT, AND PIEZOELECTRIC ELEMENT PROVIDED WITH LOWER ELECTRODE

(75) Inventor: Kazuki Shibuya, Takatsuki (JP)

(73) Assignee: KONICA MINOLTA, INC., Tokyo (JP)

( * ) Notice: Subject to any disclaimer, the term of this patent is extended or adjusted under 35 U.S.C. 154(b) by 419 days.

(21) Appl. No.: 14/119,779

(22) PCT Filed: May 9, 2012

(86) PCT No.: PCT/JP2012/061855
§ 371 (c)(1),
(2), (4) Date: Nov. 22, 2013

(87) PCT Pub. No.: WO2012/160972
PCT Pub. Date: Nov. 29, 2012

(65) Prior Publication Data
US 2014/0084753 A1    Mar. 27, 2014

(30) Foreign Application Priority Data

May 23, 2011  (JP) ................................. 2011-114295

(51) Int. Cl.
| | | |
|---|---|---|
| H01L 41/047 | (2006.01) | |
| H02N 2/00 | (2006.01) | |
| H01L 41/29 | (2013.01) | |
| H01L 41/319 | (2013.01) | |
| H01L 41/08 | (2006.01) | |

(52) U.S. Cl.
CPC .......... *H02N 2/0085* (2013.01); *H01L 41/0477* (2013.01); *H01L 41/0815* (2013.01); *H01L 41/29* (2013.01); *H01L 41/319* (2013.01)

(58) Field of Classification Search
CPC .................................... B41J 2/161; H03H 3/02
USPC .................................................... 310/363, 364
See application file for complete search history.

(56) References Cited

U.S. PATENT DOCUMENTS

| | | | |
|---|---|---|---|
| 2004/0241973 A1 | 12/2004 | Kijima et al. | |
| 2005/0191792 A1* | 9/2005 | Noguchi | ............... H01L 41/316 438/118 |
| 2007/0236104 A1 | 10/2007 | Fujii | |
| 2010/0141099 A1 | 6/2010 | Suenaga et al. | |

FOREIGN PATENT DOCUMENTS

| | | |
|---|---|---|
| CN | 1638036 | 7/2005 |
| JP | 10-095111 | 4/1998 |
| JP | 2000-068454 | 3/2000 |
| JP | 2003-017767 | 1/2003 |
| JP | 2004/311922 | 11/2004 |
| JP | 2005-198117 | 7/2005 |
| JP | 2007-281238 | 10/2007 |
| JP | 2010-161330 | 7/2010 |

* cited by examiner

*Primary Examiner* — Thomas Dougherty
(74) *Attorney, Agent, or Firm* — Cozen O'Connor

(57) ABSTRACT

In the present invention, a half-value width of a rocking curve, an average roughness of a surface, and an average grain diameter are all specified at one time with respect to a Pt layer that constitutes a lower electrode for a piezoelectric element, thereby stably film-forming the Pt layer having excellent characteristics, and stably forming, on the Pt layer, a piezoelectric thin film having excellent characteristics.

5 Claims, 8 Drawing Sheets

Pb
O
Ti or Zr

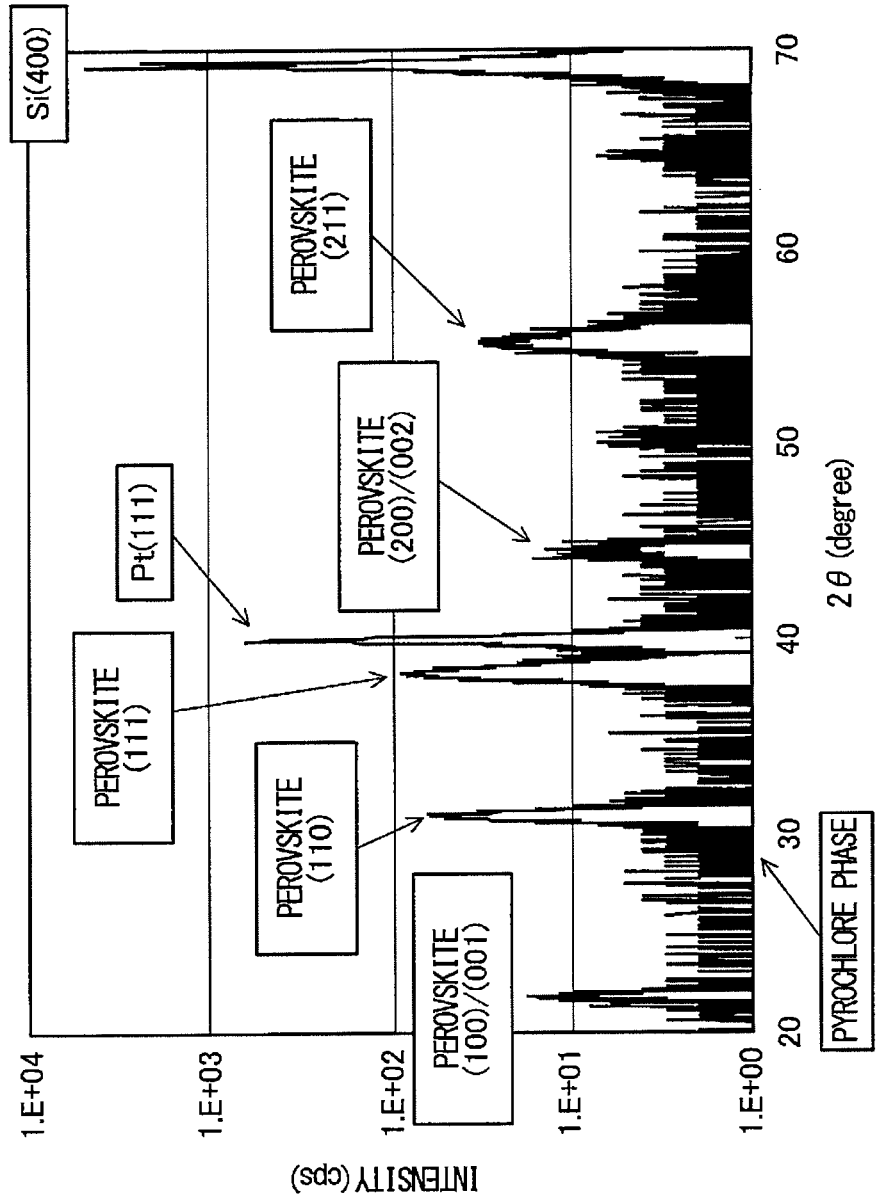

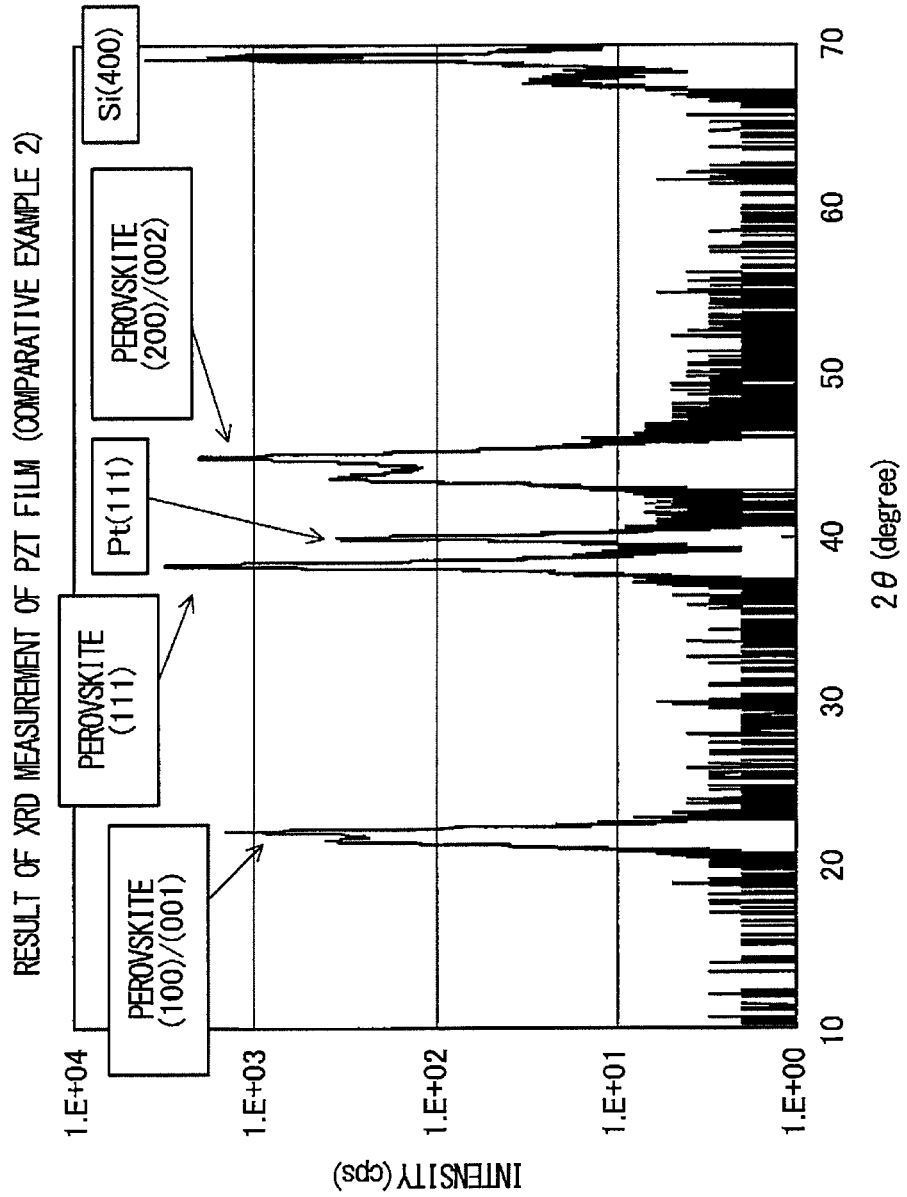

LOWER ELECTRODE FOR PIEZOELECTRIC ELEMENT, AND PIEZOELECTRIC ELEMENT PROVIDED WITH LOWER ELECTRODE

RELATED APPLICATIONS

This application is a U.S. National Phase Application under 35 USC 371 of International Application PCT/JP2012/061855 filed May 9, 2012.

This application claims the priority of Japanese application No. 2011-114295 filed May 23, 2011, the entire content of which is hereby incorporated by reference.

TECHNICAL FIELD

The present invention relates to a lower electrode for a piezoelectric element, which acts as a lower electrode underlying a piezoelectric thin film formed over a substrate, and a piezoelectric element provided with the lower electrode.

BACKGROUND ART

In recent years, as a mechano-electrical transducer for application to a driving element, a sensor, or the like, a piezoelectric material such as $Pb(Zr, Ti)O_3$ has been used. Such a piezoelectric material in the form of a thin film formed over a substrate of Si or the like is expected to be applied to MEMS (micro-electro-mechanical systems) elements.

In producing a MEMS element, high-precision processing using a semiconductor process technology such as photolithography can be used, thus allowing the element to be reduced in size and to have an increased packing density. Particularly by densely and collectively forming elements on a relatively large Si wafer such as of 6 inches or 8 inches in diameter, compared with a case of single wafer production in which elements are produced one by one, significant cost reduction can be achieved.

Furthermore, with a piezoelectric material used in the form of a thin film and a device formed in a MEMS configuration, mechano-electrical transduction efficiency is improved, and this has led further to creation of new added values such as improvements in sensitivity and characteristics of the device. For example, in a case of a thermal sensor, having a MEMS configuration, the thermal sensor is reduced in thermal conductance, so that a measurement sensitivity thereof can be increased, and in a case of an ink-jet head for a printer, nozzles thereof are provided at an increased packing density, so that high-definition patterning can be performed.

By the way, a thin film of a piezoelectric material (hereinafter, referred to also as a piezoelectric thin film) formed over an Si substrate has, due to a difference in crystal lattice constant from that of Si, a polycrystal (columnar crystal) structure in which a plurality of crystals gather together in the form of an assembly of columns. It is known that the greater the amount of such columnar crystals grown on a common crystal plane in the film thickness direction (the higher an orientation characteristic), and the larger the columnar crystals, the higher piezoelectric characteristics of the film.

A device using a piezoelectric thin film adopts a configuration in which, on a substrate of Si or the like, a lower electrode, a piezoelectric thin film, and an upper electrode are layered in this order. In this configuration, each layer is formed by using a layer underlying it as its base and thus is grown while being affected to no small degree by the underlying layer. That is, taking note of the piezoelectric thin film, the more excellent crystallinity of the lower electrode underlying it, the more excellent crystallinity of the piezoelectric thin film. Furthermore, the larger a grain size of a metal constituting the lower electrode, the larger columnar crystals of the piezoelectric thin film, and the higher an orientation characteristic of the piezoelectric thin film. Moreover, a surface roughness of the lower electrode affects crystal growth at an early stage of formation of the piezoelectric thin film and thus is a key factor that affects the orientation characteristic of the piezoelectric thin film.

From this viewpoint, for example, in Patent Document 1, on a substrate, a seed layer containing at least one element constituting a piezoelectric thin film and a lower electrode are layered in this order, and the above-described element contained in the seed layer is diffused so that the surface of the lower electrode has an arithmetic mean roughness Ra of 0.5 to 30.0 nm, in an attempt to improve a crystal orientation characteristic of the piezoelectric thin film on the lower electrode. The technical idea behind this is that, conceivably, the diffusion of the above-described element causes a precipitate to be formed on the surface of the lower electrode, and the piezoelectric thin film is grown from the precipitate as a nucleus.

Furthermore, in Patent Document 2, in forming an electrode film on a substrate, first, initial crystal nuclei of an electrode material are formed in a pattern of islands on the substrate (Step A), and then, the above-described initial crystal nuclei are grown to form a growth layer of the electrode material (Step B). At this time, a substrate temperature in Step A is set to be higher than that in Step B, so that an electrode film having excellent crystallinity is formed. Patent Document 2 discloses that a full width at half maximum of a rocking curve of the electrode film is 1.80°, and this attests to the fact that the electrode film thus formed has excellent crystallinity.

Furthermore, in Patent Document 3, in a dielectric thin film capacitor composed of a dielectric thin film having a perovskite-type crystal structure interposed between upper and lower electrodes, a Pt layer as the lower electrode is set to have an average crystal grain size of not more than 50 nm, and a full width at half maximum of a rocking curve in X-ray diffraction of a (111) plane of Pt is set to not more than 5°, so that crystallinity and roughness of the dielectric thin film overlying the Pt layer are ameliorated to improve characteristics (for example, a relative dielectric constant) of the dielectric thin film.

Furthermore, in Patent Document 4, in a piezoelectric element in which a Pt layer as a lower electrode is formed over a substrate, and a PZT thin film is formed on the Pt layer, a full width at half maximum of a rocking curve of the Pt layer is set to not more than 5°, so that a crystal orientation characteristic of the PZT thin film overlying the Pt layer is improved to provide a large piezoelectric displacement amount.

LIST OF CITATIONS

Patent Literature

Patent Document 1: JP-A-2007-281238 (see claim 5, paragraphs [0037], [0057], and [0062], etc.)
Patent Document 2: JP-A-2004-311922 (see claim 1, paragraph [0053], FIG. 4, etc.)
Patent Document 3: JP-A-2000-68454 (see claims 1 and 2, paragraphs [0011], [0012], and [0014], FIGS. 1 and 2, etc.)
Patent Document 4: JP-A-2003-17767 (see claim 1, paragraphs [0009] and [0040], etc.)

SUMMARY OF INVENTION

Technical Problem

By the way, crystallinity and an orientation characteristic of Pt constituting a lower electrode are dependent on Pt film formation conditions (for example, a substrate temperature at the time of the film formation). For this reason, in order to stably form a Pt layer having excellent characteristics, in anticipation of any change in the Pt film formation conditions, with respect to the Pt layer, it is required that not only a full width at half maximum of a rocking curve but also a mean surface roughness and an average grain size be controlled at one time.

In any of Patent Documents 1 to 4, however, with respect to the Pt layer, a full width at half maximum of a rocking curve, a mean surface roughness, and an average grain size are not all specified at one time, and hence a Pt layer having excellent characteristics cannot be stably formed. As a result, on the Pt layer, a piezoelectric thin film having excellent characteristics cannot be stably formed.

As described earlier, the larger a grain size of a metal constituting a lower electrode, the larger columnar crystals of a piezoelectric thin film overlying the, lower electrode, and the higher an orientation characteristic of the piezoelectric thin film. In any of Patent Documents 1 to 4, however, there is no disclosure at all about increasing an average grain size of Pt constituting the lower electrode so that an orientation characteristic of the piezoelectric thin film is improved. In Patent Document 3, Pt has an average grain size of at most 50 nm, which cannot be said to be sufficiently large, and thus, conceivably, an orientation characteristic of the piezoelectric thin film cannot be sufficiently improved.

In a piezoelectric element provided with a piezoelectric thin film, though a diffusion prevention layer that prevents diffusion of atoms (of, for example, Pb) in PZT toward a substrate and an orientation control layer may be included, due to a lower electrode being always present between the piezoelectric thin film and the substrate, the piezoelectric thin film is inevitably affected by crystallinity, a surface roughness, and a grain size of the lower electrode. Because of this, in order to stably form a piezoelectric thin film having excellent characteristics, it is important to favorably control characteristics of the lower electrode.

The present invention has been made to solve the above-described problem and has as its object to provide a lower electrode for a piezoelectric element, in which, with respect to a Pt layer as the lower electrode, a full width at half maximum of a rocking curve, a mean surface roughness, and an average grain size are all specified at one time, so that a Pt layer having excellent characteristics is stably formed, and thus, on the Pt layer, a piezoelectric thin film having excellent characteristics can be stably formed, and a piezoelectric element provided with the lower electrode.

Solution to Problem

According to one aspect of the present invention, there is provided a lower electrode for a piezoelectric element, which acts as a lower electrode underlying a piezoelectric thin film formed over a substrate. The lower electrode is constituted by a Pt layer, and with respect to the Pt layer, a full width at half maximum of a rocking curve in X-ray diffraction of a (111) plane of Pt is not more than 2.2°, a root-mean-square roughness RMS of the surface thereof is not more than 1.0 nm, and an average grain size of Pt is not less than 200 nm. Furthermore, according to another aspect of the present invention, there is provided a lower electrode for a piezoelectric element, which acts as a lower electrode underlying a piezoelectric thin film formed over a substrate. The lower electrode is constituted by a Pt layer, and with respect to the Pt layer, a full width at half maximum of a rocking curve in X-ray diffraction of a (111) plane of Pt is not more than 2.2°, an arithmetic mean roughness Ra of the surface thereof is not more than 0.8 nm, and an average grain size of Pt is not less than 200 nm.

Advantageous Effects of the Invention

According to the above-mentioned structure, on a lower electrode, a piezoelectric thin film having excellent characteristics can be stably formed.

BRIEF DESCRIPTION OF DRAWINGS

FIG. 10 is a graph showing a result of an evaluation by an XRD 2θ/θ measurement on a piezoelectric thin film (PZT film) formed on a lower electrode of Comparative Example 3.

FIG. 11 is a graph showing a result of an evaluation by an XRD 2θ/θ measurement on a piezoelectric thin film (PZT film) formed on a lower electrode of Comparative Example 2.

DESCRIPTION OF EMBODIMENTS

Based on the appended drawings, one embodiment of the present invention will be described as follows.

(Configuration of Piezoelectric Element)

Figure 1:
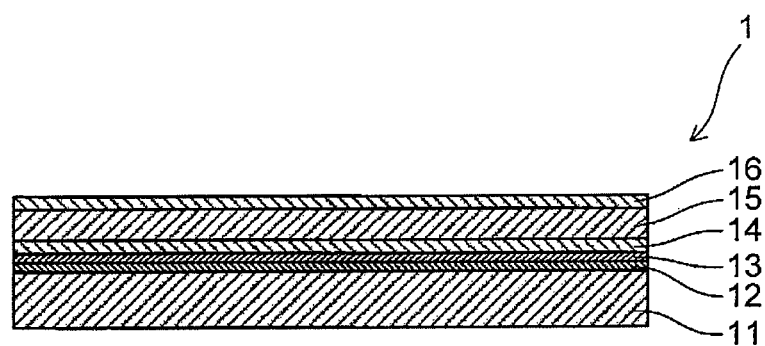
FIG. 1 is a sectional view showing an outline configuration of a piezoelectric element according to one embodiment of the present invention.

FIG. 1 is a sectional view showing an outline configuration of a piezoelectric element 1 of this embodiment. The piezoelectric element 1 is configured by forming, on a substrate 11, a thermal oxidation film 12, an adhesive layer 13, a lower electrode 14, a piezoelectric thin film 15, and an upper electrode 16 in this order.

The substrate 11 is constituted by, for example, a semiconductor substrate made of monocrystalline Si (silicon) alone or an SOI (silicon-on-insulator) substrate. The thermal oxidation film 12 is made of for example, SiO$_2$ (silicon dioxide) and is provided for the purpose of protecting and insulating the substrate 11. The adhesive layer 13 is constituted by, for example, a layer of TiOx (titanium oxide) such as TiO$_2$ (titanium dioxide) and is provided for the purpose of bringing the thermal oxidation film 12 and the lower electrode 14 into intimate contact with each other so that peeling at an interface between them is prevented.

The lower electrode 14 is an electrode (a lower electrode for a piezoelectric element) positioned beneath the piezoelectric thin film 15 and is made of Pt (platinum). The upper electrode 16 is an electrode positioned on the piezoelectric thin film 15 and is made of, for example, Pt. The upper electrode 16 may be composed of, for example, a Ti (titanium) layer and a Pt layer, in which case the Ti layer is used as an adhesive layer between the Pt layer and the piezoelectric thin film 15.

Figure 2:
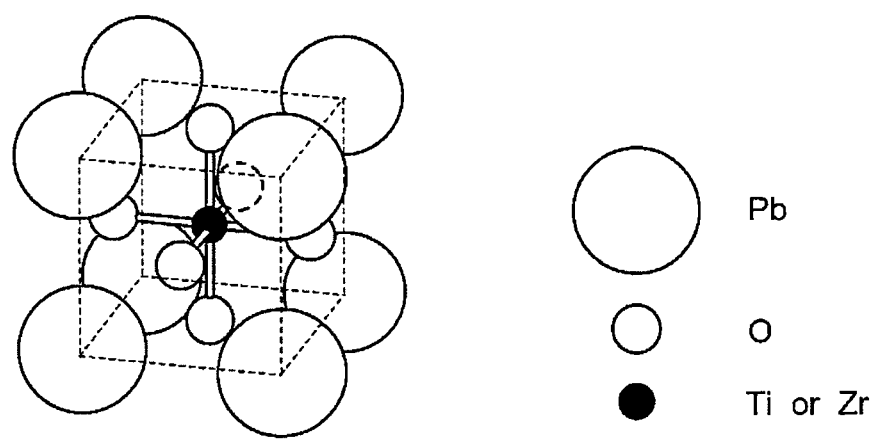
FIG. 2 is an explanatory view schematically showing a crystal structure of PZT constituting a piezoelectric thin film of the above-described piezoelectric element.

The piezoelectric thin film 15 is constituted by a thin film of PZT (lead zirconate titanate), a type of piezoelectric material. FIG. 2 schematically shows a crystal structure of PZT. The crystal structure shown in this figure is referred to as a perovskite-type structure. The perovskite-type structure refers to, in a case of a tetragonal crystal of Pb(Zr$_x$, Ti$_{1-x}$)O$_3$, a structure in which a Pb (lead) atom is located at each vertex of the tetragonal crystal, a Ti atom or a Zr (zinc) atom is located at a body center thereof, and an O (oxygen) atom is located at each plane center thereof. It is known that a piezoelectric material, when its crystal structure takes the form of the perovskite-type structure, exhibits an excellent piezoelectric effect. From this viewpoint, in the piezoelectric element 1 of this embodiment, the piezoelectric thin film 15 is made of PZT, namely, a metal oxide having the perovskite-type structure, and thus an excellent piezoelectric effect can be obtained.

The piezoelectric effect refers to such a property of a piezoelectric material that applying a stress to the piezoelectric material causes occurrence of polarization (and a voltage) and, conversely, applying a voltage thereto causes occurrence of a stress and deformation thereof. The piezoelectric thin film 15 may also be made of, instead of being formed to have this piezoelectric effect, a pyroelectric material that exhibits a pyroelectric effect or a ferroelectric material having a memory characteristic.

The pyroelectric material refers to a piezoelectric material of a type having spontaneous polarization without an electric field externally applied thereto, and has such a property that a minute temperature change leads to occurrence of dielectric polarization (and a resulting electromotive force) therein. In a case where the piezoelectric thin film 15 is made of a pyroelectric material, the piezoelectric element 1 can be used as an infrared sensor.

(Regarding Method for Producing Piezoelectric Element)

Next, a method for producing the piezoelectric element 1 configured as above will be described by way of Examples 1 and 2. Furthermore, for the sake of comparison with Examples 1 and 2, Comparative Examples 1 to 3 will also be described. FIGS. 3(a) to 3(e) are sectional views showing process steps for producing a piezoelectric element 1 of Example 1.

EXAMPLE 1

Figure 3A:
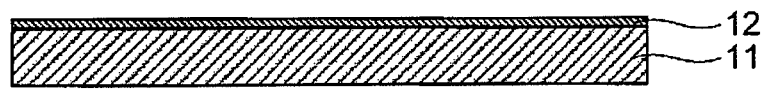
FIGS. 3(a) to 3(e) are sectional views showing process steps for producing a piezoelectric element of Example 1.

First, as shown in FIG. 3(a), on a substrate 11, a thermal oxidation film 12 is formed to be about 100 nm thick. Herein, as the substrate 11, a monocrystalline Si wafer having a thickness of about 400 μm is used. The above-described thermal oxidation film 12 is formed, by use of a wet oxidation furnace, by subjecting the above-described Si wafer to a high temperature of about 1200° C. in an oxygen atmosphere.

Figure 3B:

Subsequently, as shown in FIG. 3(b), by use of a sputtering device, on the thermal oxidation film 12, a Ti layer 13' having a thickness of about 20 nm is formed. Ti sputtering conditions used at this time are, for example, an Ar (argon) flow rate of 27 sccm, a pressure of 0.27 Pa, a substrate temperature of 145° C., and an RF power of 150 W to be applied to a target.

Figure 3C:
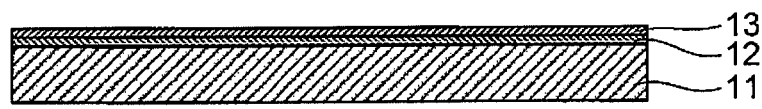

Next, as shown in FIG. 3(c), in an RTA (rapid thermal annealing) furnace, the Ti layer 13' is heated at about 700° C. in an oxygen atmosphere so that Ti is oxidized to form an adhesive layer 13 that is a TiOx layer. A study of the TiOx layer thus formed has found that a root-mean-square roughness RMS (root mean square) of its surface is not more than 2.0 nm. By decreasing a surface roughness of the TiOx layer so as to improve flatness thereof, crystallinity and an orientation characteristic of a film of Pt formed on the TiOx layer can be improved. The root-mean-square roughness RMS is expressed by Mathematical Formula 1, which will be shown later.

If a film of Pt is formed on the Ti layer 13', when subjected to a high temperature in any later process step (such as, for example, of forming a PZT thin film on the film of Pt), Ti is diffused into the Pt film to cause hillocks to be formed on the surface of the Pt layer, which may result in leakage of a PZT driving current, deterioration in orientation characteristic of PZT, and so on. With the TiOx layer formed by oxidizing Ti as described above, however, these inconveniences can be prevented. Or alternatively, in a case where, in any later process step, film formation conditions under which these phenomena are unlikely to occur can be satisfied, in place of the TiOx layer, the Ti layer may be used as the adhesive layer.

Figure 3D:
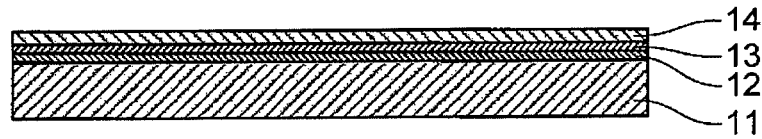

Next, as shown in FIG. 3(d), on the adhesive layer 13, a film of Pt is formed by sputtering to form a lower electrode 14 having a thickness of, for example, 80 nm. Pt sputtering conditions used at this time are, for example, an Ar flow rate of 20 sccm, a pressure of 0.27 Pa, a substrate temperature of 420° C., and an RF power of 150 W.

Figure 3E:
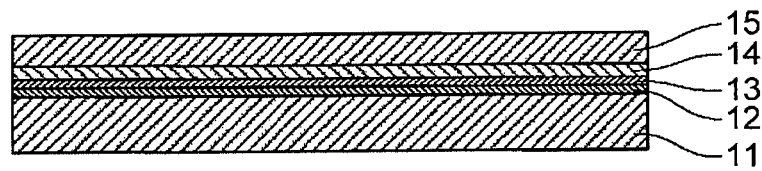

Subsequently, as shown in FIG. 3(e), on the lower electrode 14, a film of PZT is formed by sputtering to form a piezoelectric thin film 15 having a thickness of 4 μm. PZT sputtering conditions used at this time are an Ar flow rate of 25 sccm, an O$_2$ flow rate of 0.8 sccm, a substrate temperature of 500° C., a pressure of 0.4 Pa, and an RF power of 400 W.

Lastly, on the piezoelectric thin film 15, a film of Pt is formed by sputtering to form an upper electrode 16, and thus the piezoelectric element 1 shown in FIG. 1 can be obtained.

EXAMPLE 2

In Example 2, except that the substrate temperature at the time of forming a film of Pt constituting a lower electrode 14 was set to 520° C., the same conditions as those in Example 1 were used to form a piezoelectric element 1.

COMPARATIVE EXAMPLE 1

In Comparative Example 1, except that the substrate temperature at the time of forming a film of Pt constituting a lower electrode was set to 220° C., the same conditions as those in Example 1 were used to form a piezoelectric element.

COMPARATIVE EXAMPLE 2

In Comparative Example 2, except that the substrate temperature at the time of forming a film of Pt constituting a lower electrode was set to 320° C., the same conditions as those in Example 1 were used to form a piezoelectric element.

COMPARATIVE EXAMPLE 3

In Comparative Example 3, except that the substrate temperature at the time of forming a film of Pt constituting a lower electrode was set to 565° C., the same conditions as those in Example 1 were used to form a piezoelectric element.
(Evaluation of Lower Electrode)
Next, with respect to each of the lower electrodes formed respectively in Examples 1 to 2 and Comparative Examples 1 to 3, prior to forming the piezoelectric thin film thereon, an evaluation by XRD (X-ray diffraction) and an evaluation by surface observation by use of an AFM (atomic force microscope) were performed. Results thereof are described below. In the following, it is assumed that the term "Pt (or Pt layer)" refers to the Pt (or Pt layer) constituting the lower electrode on the TiOx layer.

Figure 4:
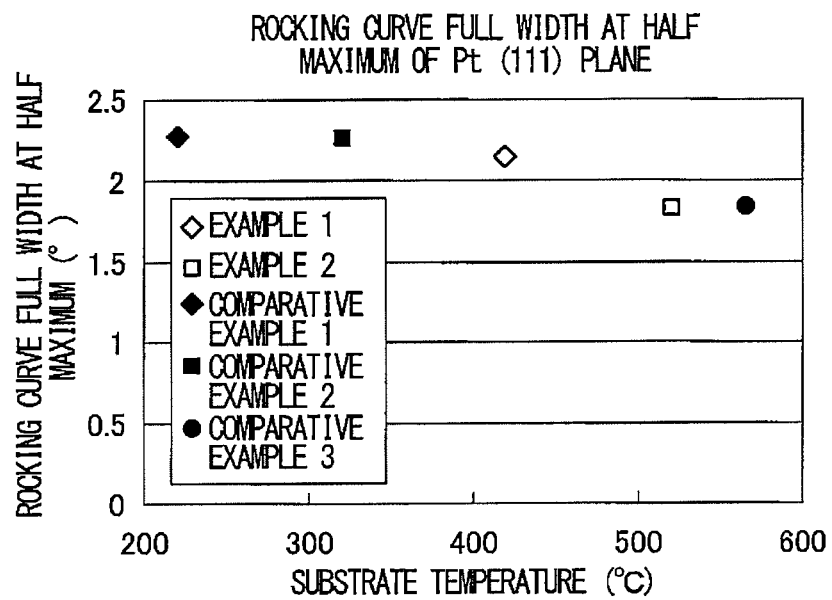
FIG. 4 is a graph showing a relationship between a substrate temperature at the time of forming a film of Pt as a lower electrode of the above-described piezoelectric element and a full width at half maximum of a rocking curve in X-ray diffraction of a (111) plane of Pt.

FIG. 4 shows a relationship between the substrate temperature at the time of forming the film of Pt and a full width at half maximum of a rocking curve in X-ray diffraction of a (111) plane of Pt. The rocking curve refers to a curve indicating an intensity distribution with respect to a change in diffraction conditions, and, in general, the more complete a crystal, the narrower a full width at half maximum represented by the curve. It is understood from FIG. 4 that as the substrate temperature at the time of forming the film of Pt increases, the full width at half maximum of the rocking curve decreases.

Figure 5:
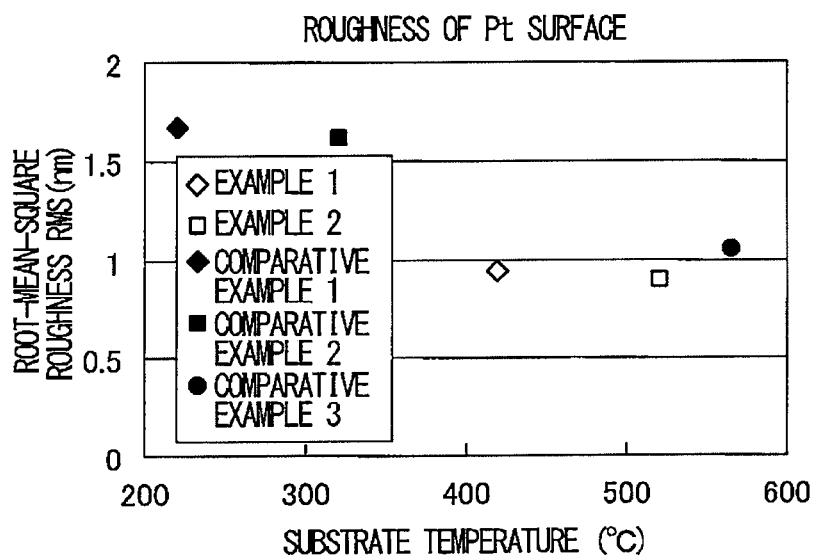
FIG. 5 is a graph showing a relationship between the above-mentioned substrate temperature at the time of forming the film of Pt and a root-mean-square roughness RMS of the surface of the Pt layer.
Figure 6:
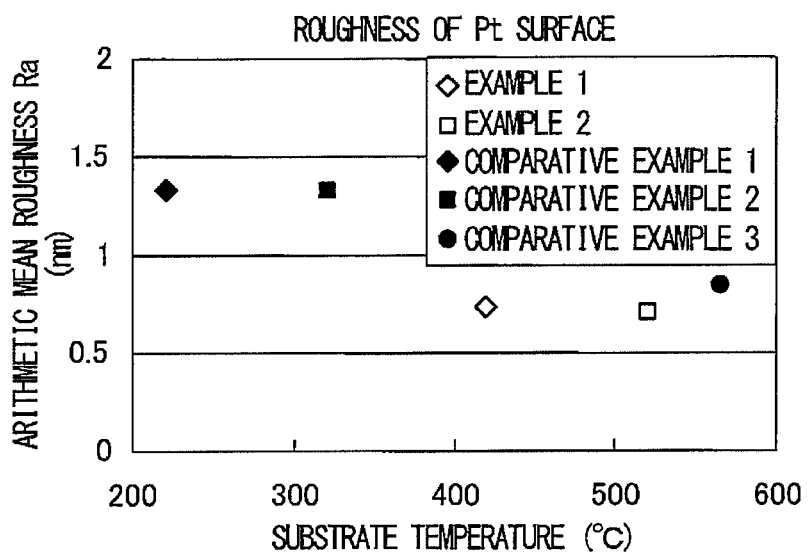
FIG. 6 is a graph showing a relationship between the above-mentioned substrate temperature at the time of forming the film of Pt and an arithmetic mean roughness Ra of the surface of the Pt layer.
Figure 7:
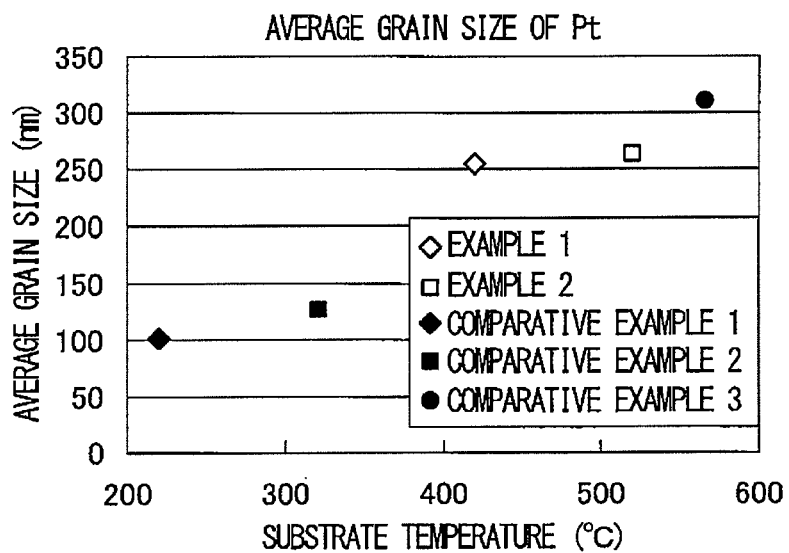
FIG. 7 is a graph showing a relationship between the substrate temperature at the time of forming the film of Pt and an average grain size of Pt.

Furthermore, each of FIGS. 5 and 6 shows a relationship between the substrate temperature at the time of forming the film of Pt and a surface roughness of the Pt layer measured by use of the AFM. Specifically, FIG. 5 shows the surface roughness in terms of a root-mean-square roughness RMS (or Rq), and FIG. 6 shows the surface roughness in terms of an arithmetic mean roughness Ra. Moreover, FIG. 7 shows a relationship between the substrate temperature at the time of forming the film of Pt and an average grain size of Pt measured by use of the AFM.

The root-mean-square roughness RMS and the arithmetic mean roughness Ra are expressed by formulae below. In the following formulae, it is assumed that a roughness curve is expressed as y=f(x). Here, from the roughness curve, a reference length L is extracted in a direction of a mean line of the roughness curve, and the direction of the mean line in this extracted part is defined as an x axis, while a direction of a vertical magnification therein is defined as a y axis. Also, values of y, L, Rms, and Ra are all in the unit of nm herein.

$$RMS = \sqrt{\frac{1}{L}\int_0^L f^2(x)\,dx}$$ [Mathematical Formula 1]

$$Ra = \frac{1}{L}\int_0^L |f(x)|\,dx$$ [Mathematical Formula 2]

In each of Comparative Examples 1 and 2, the rocking curve full width at half maximum of the (111) plane of the Pt layer is larger than 2.2°, so that it cannot be said that crystallinity of Pt is excellent. Furthermore, in each of Comparative Examples 1 to 3, the root-mean-square roughness RMS of the surface of the Pt layer is larger than 1.0 nm, and the arithmetic mean roughness Ra of the surface of the Pt layer is larger than 0.8 nm, so that it cannot be said that flatness of the surface of the Pt layer is excellent. Hence, columnar crystals of the piezoelectric thin film cannot be grown on a common crystal plane in the film thickness direction, and thus an orientation characteristic of the piezoelectric thin film cannot be improved. As a result, a piezoelectric element having excellent piezoelectric characteristics cannot be obtained.

On the other hand, in each of Examples 1 and 2, the rocking curve full width at half maximum of the Pt layer is not more than 2.2°, so that it can be said that the Pt film obtained has excellent crystallinity. Thus, on the Pt layer, the piezoelectric thin film 15 can be formed having excellent crystallinity. Furthermore, in each of Examples 1 and 2, the root-mean-square roughness RMS of the surface of the Pt layer is not more than 1.0 nm, and the arithmetic mean roughness Ra of the surface of the Pt layer is not more than 0.8 nm, so that it can be said that flatness of the surface of the Pt layer is excellent. Moreover, in each of Examples 1 and 2, the average grain size of Pt is as large as not less than 200 nm. As a result, in forming the piezoelectric thin film 15 on the Pt layer, from an early stage of the formation, columnar crystals of the piezoelectric thin film 15 can be grown to a large size on a common crystal plane in the film thickness direction, and thus the orientation characteristic of the piezoelectric thin film 15 can be improved.

As described above, according to Examples 1 and 2, the crystallinity and orientation characteristic of the piezoelectric thin film 15 can be improved, and thus the piezoelectric element 1 can be realized having excellent piezoelectric characteristics.

Figure 8:
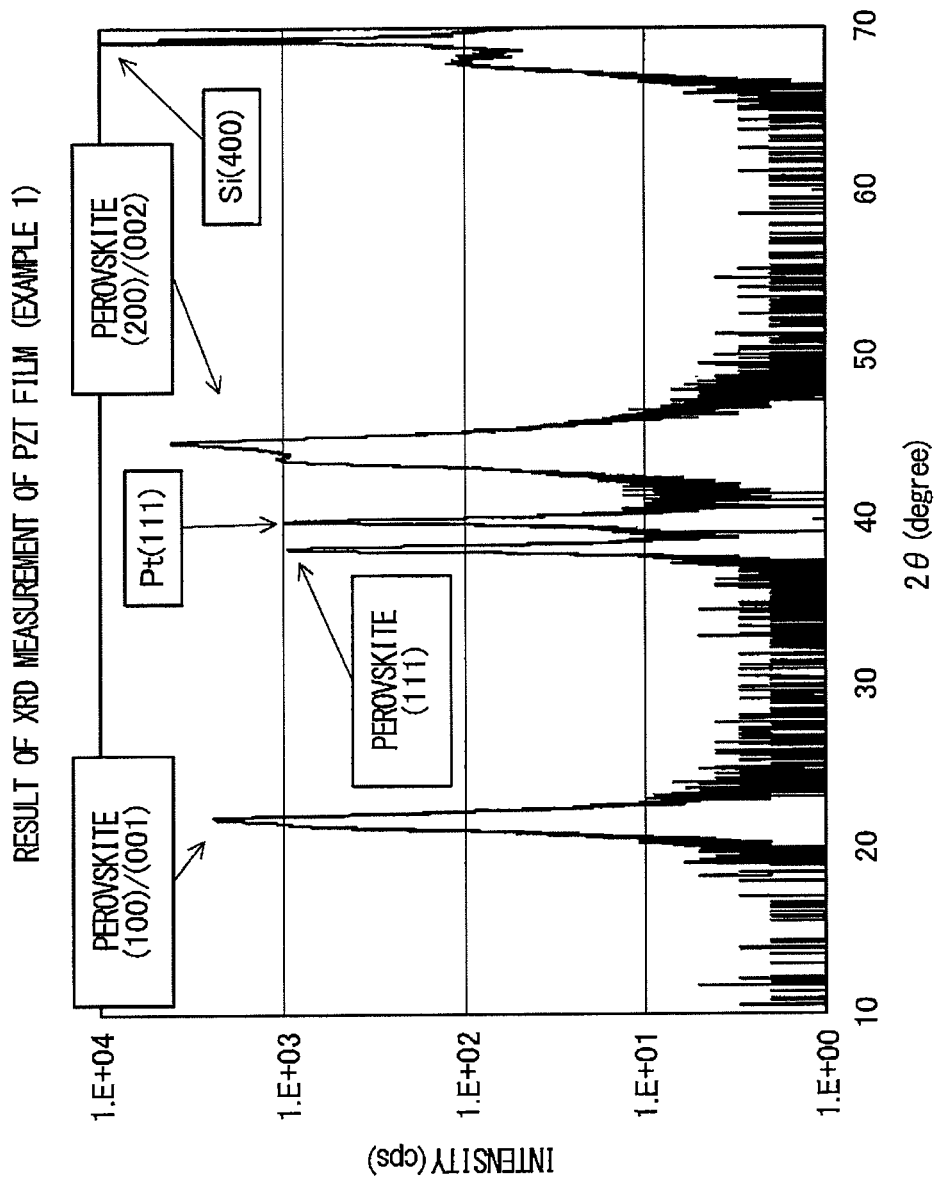
FIG. 8 is a graph showing a result of an evaluation by an XRD 2θ/θ measurement on a piezoelectric thin film (PZT film) formed on the lower electrode of Example 1.

FIG. 8 shows a result of an evaluation by an XRD 2θ/θ measurement on a PZT film formed as the piezoelectric thin film 15 on the lower electrode 14 of Example 1. An intensity indicated by the vertical axis is shown in terms of an X-ray count per second (cps), and "1. E+n" indicates 1×10$^n$. According to the relationship between 2θ and each intensity peak shown in this figure, the most conspicuous peak is a peak representing a (100)/(001) plane, so that it is understood that obtained as a crystal structure of the PZT film formed is a favorable perovskite-type crystal structure that exhibits an excellent piezoelectric effect, having a preferred orientation with the (100)/(001) plane.

Figure 9:
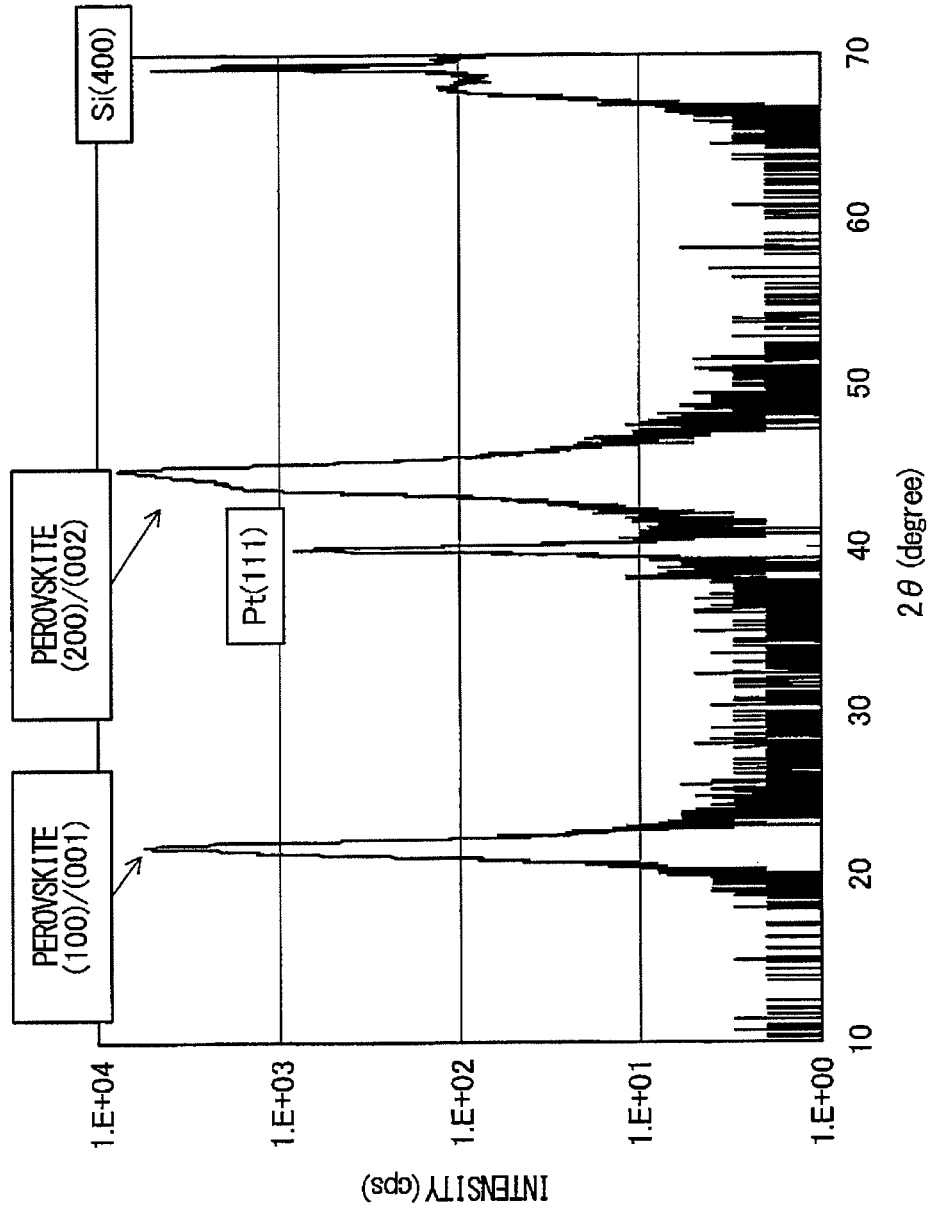
FIG. 9 is a graph showing a result of an evaluation by an XRD 2θ/θ measurement on a piezoelectric thin film (PZT film) formed on a lower electrode of Example 2.

FIG. 9 shows a result of an evaluation by an XRD 2θ/θ measurement on a PZT film formed as the piezoelectric thin film 15 on the lower electrode 14 of Example 2. Since, in this figure, a peak representing a (100)/(001) plane is conspicuous, and a peak representing a (111) plane is low, it is understood that obtained as a crystal structure of the PZT film formed is a favorable perovskite-type crystal structure that has a preferred orientation with the (100)/(001) plane.

FIG. 10 shows a result of an evaluation by an XRD 2θ/θ measurement on a PZT film formed as the piezoelectric thin film on the lower electrode of Comparative Example 3. Since, in this figure, while a peak representing a (100)/(001) plane is low, there is also a peak representing a (110) plane, it can be said that obtained as a crystal structure of the PZT film formed is not a preferable crystal structure.

FIG. 11 shows a result of an evaluation by an XRD 2θ/θ measurement on a PZT film formed as the piezoelectric thin film on the lower electrode of Comparative Example 2. In the result of the evaluation on the PZT film of Comparative Example 2, though the result is closer to the results of Examples than to the result of Comparative Example 3, nevertheless, a peak representing a (111) plane is more conspicuous than a peak representing a (100)/(001) plane, so that it cannot be said that an optimum crystal structure is obtained.

Furthermore, by, as in Examples 1 and 2, satisfying all the conditions required of the Pt layer, which are a rocking curve full width at half maximum of not more than 2.2°, the root-mean-square roughness RMS of its surface of not more than 1.0 nm (or alternatively, the arithmetic mean roughness Ra of its surface of not more than 0.8 nm), and an average grain size of Pt of not less than 200 nm, even when there occurs a change in Pt film formation conditions within such a range that these conditions are satisfied, it is possible to form a Pt layer excellent in crystallinity and in orientation characteristic and thus to stably form a Pt layer having excellent characteristics. As a result, on the Pt layer, the piezoelectric thin film 15 can be stably formed having excellent characteristics. A piezoelectric constant d31 of each of the piezoelectric thin films formed respectively on the lower electrodes of Examples 1 and 2 and Comparative Examples 2 and 3 was measured, and results of the measurement were—d31=138 pm/V in Example 1 and—d31=152 pm/V in Example 2, as contrasted with—d31=115 pm/V in Comparative Example 2 and—d31=97 pm/V in Comparative Example 3.

For example, as seen in FIGS. 4 to 7, even when the substrate temperature at the time of forming the film of Pt varies within a range between not lower than 370° C. and not higher than 540° C., the above-described conditions required of the Pt layer regarding the rocking curve full width at half maximum, the surface roughness, and the average grain size can be all satisfied at one time. Consequently, a Pt layer having excellent characteristics can be stably formed, and thus the piezoelectric thin film 15 can be stably formed having excellent characteristics.

It is particularly noted that, since the average grain size of Pt is as large as not less than 250 nm, on the Pt layer, columnar crystals of the piezoelectric thin film 15 are grown to an even larger size, and thus the orientation characteristic of the piezoelectric thin film 15 is reliably improved. Thus, the characteristics of the piezoelectric thin film 15 are reliably improved. In this case, as seen in FIG. 7, the range of permissible variations in substrate temperature at the time of forming the film of Pt is as narrow as between not lower than 400° C. and not higher than 540° C., and even so, it can still be said that even when the substrate temperature varies within this range, the piezoelectric thin film 15 can be obtained having excellent characteristics.

The lower electrode for a piezoelectric element described thus far is a lower electrode for a piezoelectric element, which acts as a lower electrode underlying a piezoelectric thin film formed over a substrate. The lower electrode is constituted by a Pt layer, and with respect to the Pt layer, a full width at half maximum of a rocking curve in X-ray diffraction of a (111) plane of Pt is not more than 2.2°, the root-mean-square roughness RMS (or Rq) of its surface is not more than 1.0 nm, and an average grain size of Pt is not less than 200 nm. Furthermore, the lower electrode for a piezoelectric element described thus far is a lower electrode for a piezoelectric element, which acts as a lower electrode underlying a piezoelectric thin film formed over a substrate. The lower electrode is constituted by a Pt layer, and with respect to the Pt layer, a full width at half maximum of a rocking curve in X-ray diffraction of a (111) plane of Pt is not more than 2.2°, the arithmetic mean roughness Ra of its surface is not more than 0.8 nm, and an average grain size of Pt is not less than 200 nm.

According to the above-described configurations, in a case where the lower electrode is constituted by a Pt layer, a full width at half maximum of a rocking curve of a (111) plane of Pt is not more than 2.2°, and thus the Pt layer has excellent crystallinity, so that crystallinity of a piezoelectric thin film formed on the Pt layer can be improved. Further, a piezoelectric thin film that has a favorable crystal structure having a preferred orientation with a (100)/(001) plane can be obtained.

Furthermore, the root-mean-square roughness RMS of the surface of the Pt layer is not more than 1.0 nm, or alternatively, the arithmetic mean roughness Ra of the surface of the Pt layer is not more than 0.8 nm, so that flatness of the surface of the Pt layer is secured, and thus, from an early stage of formation of a piezoelectric thin film, columnar crystals of the piezoelectric thin film can be grown on a common plane in the film thickness direction. Moreover, the average grain size of Pt is not less than 200 nm, and thus columnar crystals of the piezoelectric thin film can be grown to a large size. As described above, the Pt layer that acts as a base for a piezoelectric thin film has a small surface roughness and a large average grain size of Pt, and thus an orientation characteristic of the piezoelectric thin film can be improved. By satisfying these conditions, a piezoelectric thin film that has a favorable crystal structure having a preferred orientation with a (100)/(001) plane can be obtained.

Furthermore, by satisfying all the conditions required of the Pt layer regarding the full width at half maximum of a rocking curve, the mean roughness of its surface, and the average gain size, even when there occurs a change in Pt film formation conditions (for example, a substrate temperature at the time of film formation) within such a range that these conditions are satisfied, it is possible to form a Pt layer that is excellent in crystallinity and in orientation characteristic and thus to stably form a Pt layer having excellent characteristics. As a result, on the Pt layer, a piezoelectric thin film having excellent characteristics can be stably formed.

Furthermore, in the above-described lower electrode for a piezoelectric element, more preferably, the average grain size of Pt of the Pt layer is not less than 250 nm.

In this case, columnar crystals of a piezoelectric thin film formed on the Pt layer can be grown to an even larger size, and thus the orientation characteristic of the piezoelectric thin film can be reliably improved.

The piezoelectric element described thus far is a piezoelectric element in which, on a substrate, a lower electrode, a piezoelectric thin film, and an upper electrode are formed in this order, and the lower electrode is constituted by the aforementioned lower electrode for a piezoelectric element.

According to this configuration, on the lower electrode, a piezoelectric thin film having excellent characteristics is stably formed, and thus a piezoelectric element having excellent characteristics as an element can be stably obtained.

Furthermore, in the above-described piezoelectric element, preferably, an adhesive layer is formed between the substrate and the lower electrode. With the adhesive layer provided, peeling between the lower electrode and a layer lying under the lower electrode can be prevented. As the adhesive layer, preferably used is a TiOx layer.

In the above-described piezoelectric element, in a case where a TiOx layer is provided as the adhesive layer, preferably, a root-mean-square roughness RMS of the surface of the TiOx layer is not more than 2.0 nm. Since the TiOx layer has a small surface roughness, and thus flatness of its surface is improved, crystallinity and an orientation characteristic of Pt of a lower electrode formed on the TiOx layer can be improved.

As discussed above, by satisfying all conditions required of a Pt layer regarding a full width at half maximum of a rocking curve, a mean roughness of its surface, and an average grain size, a Pt layer having excellent characteristics can be stably formed. As a result, on the Pt layer, a piezoelectric thin film having excellent characteristics can be stably formed. Furthermore, a piezoelectric thin film having a preferred orientation with a (100)/(001) plane can be formed.

INDUSTRIAL APPLICABILITY

The present invention is applicable to, for example, actuators for MEMS (particularly, an actuator for an ink-jet head), sensors (a thermal sensor, an ultrasound sensor), frequency filters, and involatile memories.

LIST OF REFERENCE SYMBOLS 1 piezoelectric element
11 substrate
13 adhesive layer
14 lower electrode (lower electrode for piezoelectric element)
15 piezoelectric thin film
16 upper electrode The inveition claimed is:

1. A lower electrode for a piezoelectric element, which acts as a lower electrode underlying a piezoelectric thin film formed over a substrate, comprising:
   a Pt layer,
   wherein with respect to the Pt layer,
   a full width at half maximum of a rocking curve in X-ray diffraction of a (111) plane of Pt is not more than 2.2°,
   a surface roughness thereof satisfies at least one of following: a root-mean-square roughness RMS of not more than 1.0 nm, and an arithmetic mean roughness Ra of not more than 0.8 nm, and
   an average grain size of Pt is not less than 200 nm.

2. The lower electrode for a piezoelectric element according to claim 1, wherein
   the average grain size of Pt of the Pt layer is not less than 250 nm.

3. A piezoelectric element, comprising:
   a substrate:
   a lower electrode;
   a piezoelectric thin film; and
   an upper electrode,
   the lower electrode, the piezoelectric thin film, and the upper electrode being formed on the substrate in this order,
   wherein the lower electrode is constituted by the lower electrode for a piezoelectric element according to claim 1.

4. The piezoelectric element according to claim 3, wherein
   a TiOx layer as an adhesive layer is formed between the substrate and the lower electrode.

5. The piezoelectric element according to claim 4, wherein
   a root-mean-square roughness RMS of a surface of the TiOx layer as the adhesive layer is not more than 2.0 nm.

* * * * *